(12) United States Patent
Li et al.

(10) Patent No.: US 11,631,709 B2
(45) Date of Patent: Apr. 18, 2023

(54) SOLID-STATE IMAGE SENSOR

(71) Applicant: VisEra Technologies Company Limited, Hsin-Chu (TW)

(72) Inventors: Ching-Hua Li, Taoyuan (TW); Yu-Chi Chang, Hukou Township, Hsinchu County (TW); Cheng-Hsuan Lin, Taipei (TW); Han-Lin Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 141 days.

(21) Appl. No.: 16/814,237

(22) Filed: Mar. 10, 2020

(65) Prior Publication Data
US 2021/0288090 A1 Sep. 16, 2021

(51) Int. Cl.
*H01L 27/146* (2006.01)

(52) U.S. Cl.
CPC .. *H01L 27/14621* (2013.01); *H01L 27/14627* (2013.01)

(58) Field of Classification Search
None
See application file for complete search history.

(56) References Cited

U.S. PATENT DOCUMENTS

| | | | | |
|---|---|---|---|---|
| 10,056,426 B2 * | 8/2018 | Cheng | | H01L 27/14685 |
| 11,102,431 B2 * | 8/2021 | Jo | | H04N 17/02 |
| 2013/0270667 A1 * | 10/2013 | Wang | | H01L 27/14621 257/443 |
| 2016/0351605 A1 * | 12/2016 | Yang | | H01L 27/14625 |
| 2018/0158864 A1 * | 6/2018 | Kim | | H01L 27/14609 |
| 2019/0148434 A1 * | 5/2019 | Hsu | | H01L 27/14629 257/432 |
| 2019/0259796 A1 * | 8/2019 | Cho | | H01L 27/14605 |
| 2019/0348458 A1 * | 11/2019 | Jangjian | | H01L 27/14627 |
| 2020/0403025 A1 * | 12/2020 | Kim | | H01L 27/14621 |

(Continued)

FOREIGN PATENT DOCUMENTS

| | | | | |
|---|---|---|---|---|
| JP | 2010-034141 A | 2/2010 | | |
| JP | 2014-522118 A | 8/2014 | | |
| JP | 2014-165907 | * 9/2014 | | H01L 27/14 |

(Continued)

*Primary Examiner* — Ali Naraghi
(74) *Attorney, Agent, or Firm* — Muncy, Geissler, Olds & Lowe, P.C.

(57) ABSTRACT

A solid-state image sensor is provided. The solid-state image sensor includes a plurality of photoelectric conversion elements. The solid-state image sensor also includes a first color filter layer disposed above the photoelectric conversion elements and having a plurality of first color filter segments. The solid-state image sensor further includes a second color filter layer disposed adjacent to the first color filter layer and having a plurality of second color filter segments. The solid-state image sensor includes a first grid structure disposed between the first color filter layer and the second color filter layer. The first grid structure has a first grid height. The solid-state image sensor also includes a second grid structure disposed between the first color filter segments and between the second color filter segments. The second grid structure has a second grid height that is lower than or equal to the first grid height.

17 Claims, 17 Drawing Sheets

(56) References Cited

U.S. PATENT DOCUMENTS

2021/0082990 A1* 3/2021 Zhao ................. H01L 27/14603
2021/0202546 A1* 7/2021 Liu ..................... H01L 27/1463

FOREIGN PATENT DOCUMENTS

| JP | 2014-165907 | A | 9/2014 | | |
| JP | 2015510259 | A | 4/2015 | | |
| JP | 2017063171 | A | 3/2017 | | |
| JP | 2019175912 | A | 10/2019 | | |
| KR | 10-2018-0116781 | A | 10/2018 | | |
| KR | 10-2019-0012806 | A | 2/2019 | | |
| KR | 10-2019-0055732 | A | 5/2019 | | |
| KR | 10-2019-0055732 | * | 1/2021 | ........... | H01L 27/146 |
| WO | WO2018/174147 | A1 | 9/2018 | | |

* cited by examiner

SOLID-STATE IMAGE SENSOR

BACKGROUND

Technical Field

The embodiments of the present disclosure relate to image sensors, and in particular they relate to solid-state image sensors that include grid structures having different grid heights.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light sensing portion in the solid-state image sensor may be formed at each of a plurality of pixels, and signal electric charges may be generated according to an amount of light received in the light sensing portion. In addition, the signal electric charges generated in the light sensing portion may be transmitted and amplified, whereby an image signal is obtained.

In solid-state image sensor, the grid structure may be used to separate the different color filter layers. However, general grid structure has a constant grid height, which may split and diffract light into several beams travelling in different directions (like a diffraction grating), thereby causing petal flares in the obtained image. In addition, crosstalk between different color filter layers may be occurred in general solid-state image sensor. Therefore, there are still various challenges in the design and manufacturing of solid-state image sensors.

BRIEF SUMMARY

In some embodiments of the present disclosure, the solid-state image sensor includes grid structures having different grid heights, which may prevent the grid structures from generating diffraction, thereby improving the quality of the image signal from the photoelectric conversion elements of the solid-state image sensors.

In accordance with some embodiments of the present disclosure, a solid-state image sensor is provided. The solid-state image sensor includes a plurality of photoelectric conversion elements. The solid-state image sensor also includes a first color filter layer disposed above the photoelectric conversion elements. The first color filter layer has a plurality of first color filter segments. The solid-state image sensor further includes a second color filter layer disposed above the photoelectric conversion elements and adjacent to the first color filter layer. The second color filter layer has a plurality of second color filter segments. The solid-state image sensor includes a first grid structure disposed between the first color filter layer and the second color filter layer. The first grid structure has a first grid height. The solid-state image sensor also includes a second grid structure disposed between the first color filter segments and between the second color filter segments. The second grid structure has a second grid height that is lower than or equal to the first grid height.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
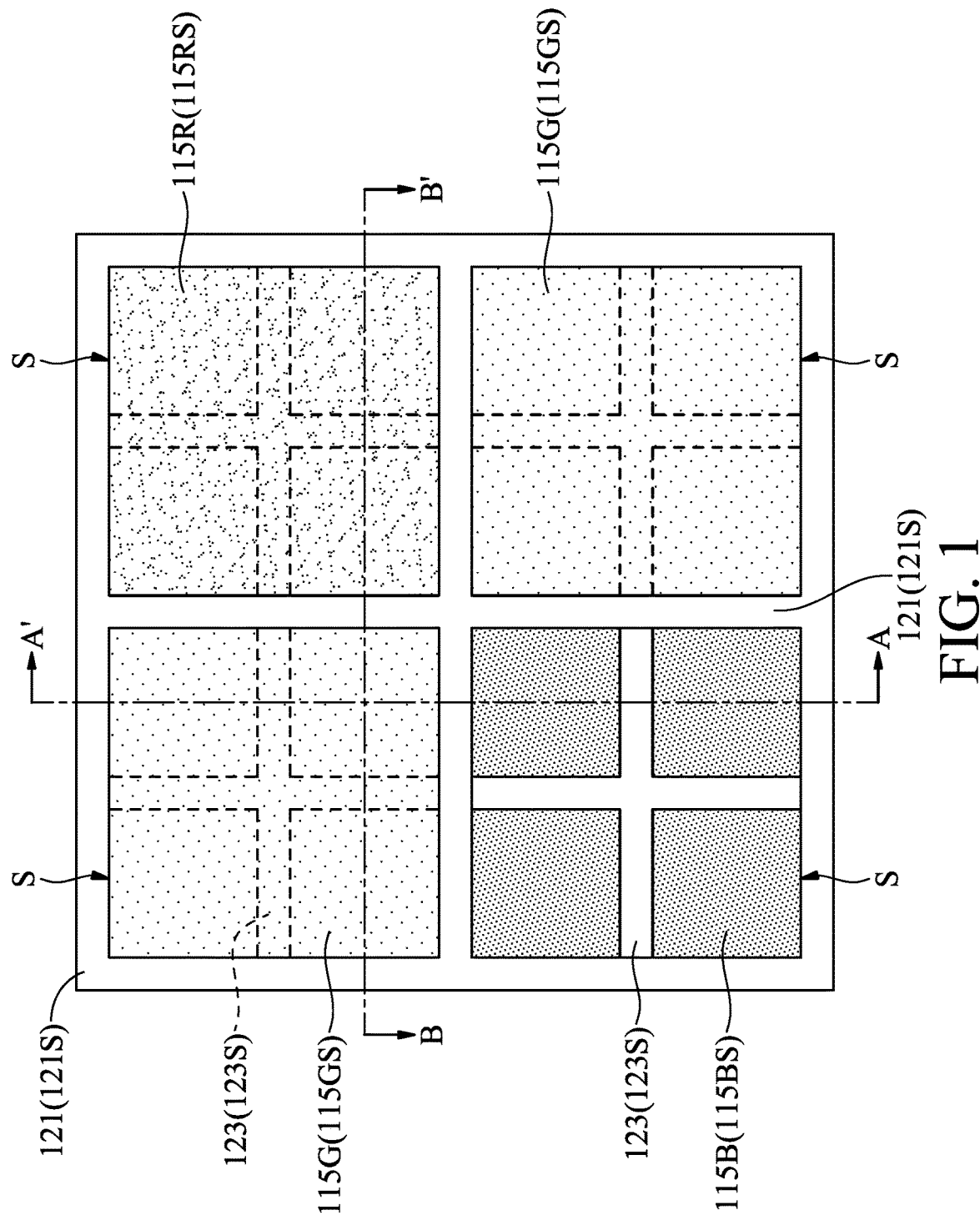
FIG. 1 is a top view illustrating a solid-state image sensor according to one embodiment of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed. For imaging a color image, color filter layers may be provided in the FSI and BSI image sensors. The FSI and BSI image sensors usually have a grid structure for separating the color filter layers to prevent color mixture.

According to some embodiments of the present disclosure, the solid-state image sensor may include two different grid structures having different grid heights, which may prevent the grid structures from generating diffraction, thereby improving the quality of the image signal from the photoelectric conversion elements (which may be arranged in, for example, normal pixels or phase detection auto focus (PDAF) pixels) of the solid-state image sensors.

Figure 2:
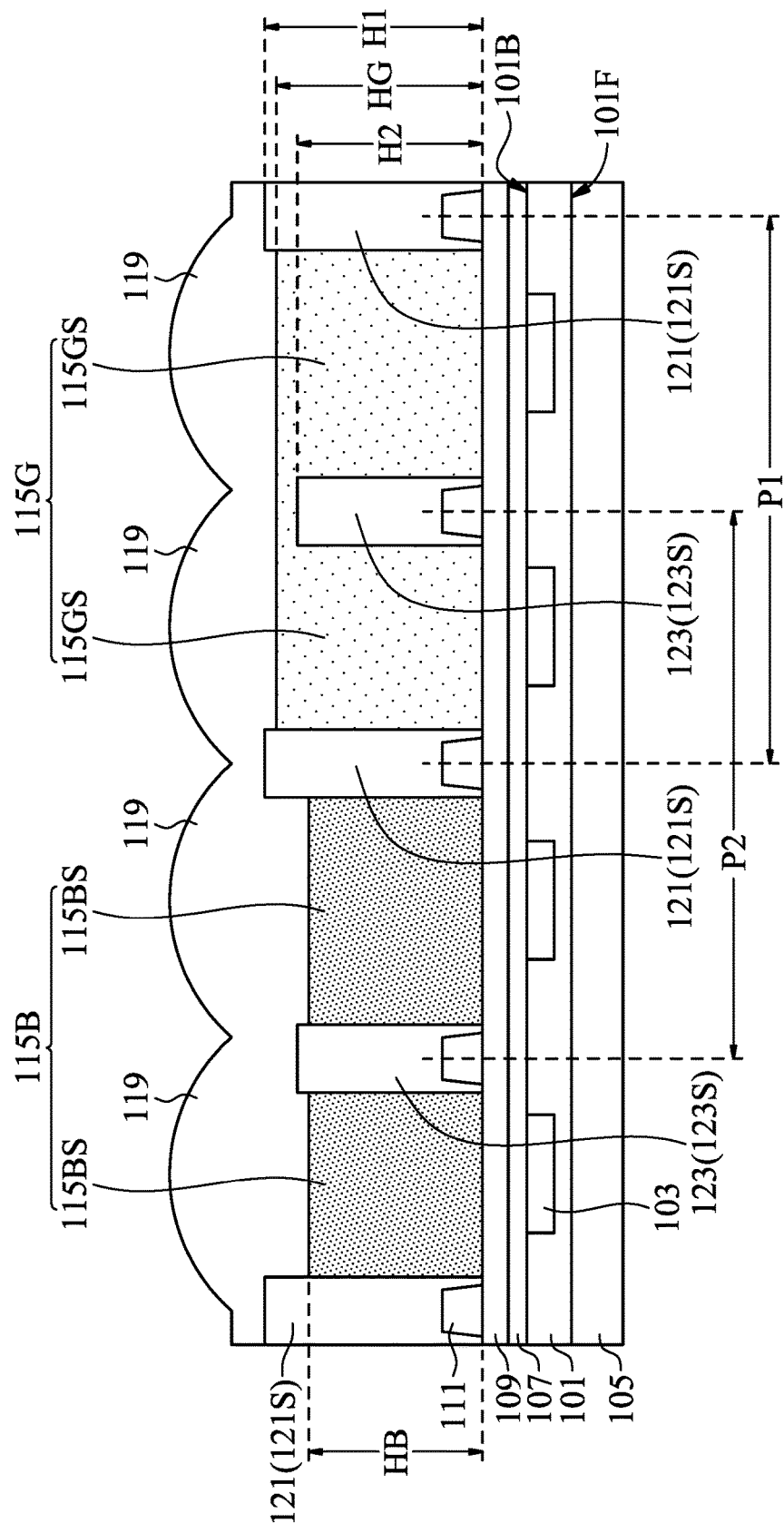
FIG. 2 is a cross-sectional view of the solid-state image sensor along line A-A' in FIG. 1.
Figure 3:
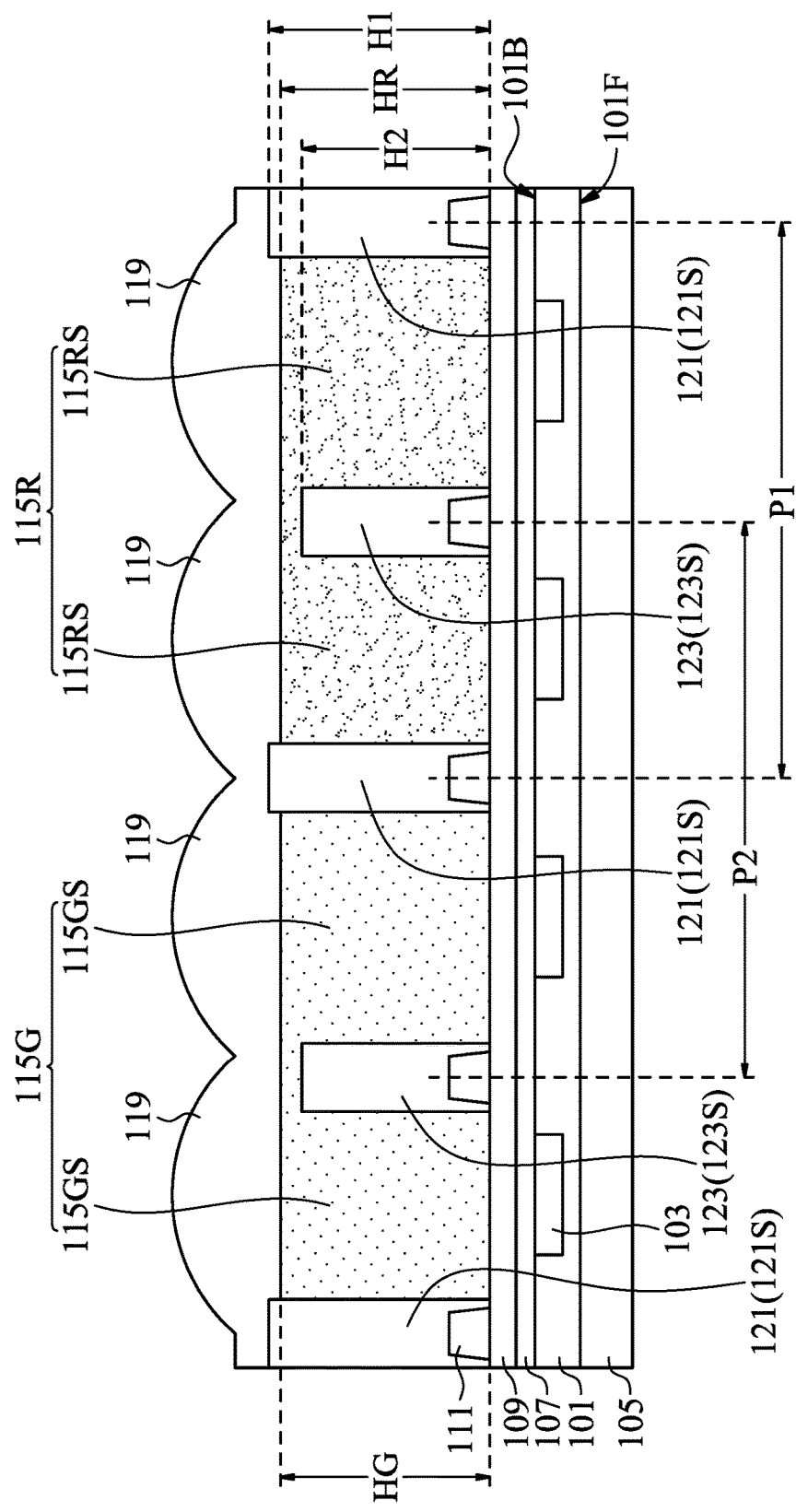
FIG. 3 is a cross-sectional view of the solid-state image sensor along line B-B' in FIG. 1.

FIG. 1 is a top view illustrating a solid-state image sensor 10 according to one embodiment of the disclosure. FIG. 2 is a cross-sectional view of the solid-state image sensor 10 along line A-A' in FIG. 1. FIG. 3 is a cross-sectional view of the solid-state image sensor 10 along line B-B' in FIG. 1. It should be noted that some components of the solid-state image sensor 10 may be omitted in FIG. 1 to FIG. 3 for the sake of brevity.

In some embodiments, the solid-state image sensor 10 may be a complementary metal-oxide semiconductor (CMOS) image sensor or a charge coupled device (CCD) image sensor, but the present disclosures is not limited thereto. As shown in FIG. 2 and FIG. 3, the solid-state image sensor 10 includes a semiconductor substrate 101 which may be, for example, a wafer or a chip, but the present disclosure is not limited thereto. The semiconductor substrate 101 has a front surface 101F and a back surface 101B opposite to the front surface 101F. Multiple photoelectric conversion elements 103 such as photodiodes may be formed in the semiconductor substrate 101.

In some embodiments, the photoelectric conversion elements 103 in the semiconductor substrate 101 may be isolated from each other by isolation structures (not shown) such as shallow trench isolation (STI) regions or deep trench isolation regions. The isolation structures may be formed in the semiconductor substrate 101 using etching process to form trenches and filling the trenches with an insulating or dielectric material.

In some embodiments, the photoelectric conversion elements 103 are formed on the back surface 101B of the semiconductor substrate 101, and a wiring layer 105 is formed on the front surface 101F of the semiconductor substrate 101, but the present disclosure is not limited thereto. The wiring layer 105 may be an interconnect structure that includes multiple conductive lines and vias embedded in multiple dielectric layers, and may further include various electric circuits required for the solid-state image sensor 10. Incident lights may radiate onto the side of the back surface 101B and be received by the photoelectric conversion elements 103.

The solid-state image sensor 10 as shown in FIG. 2 and FIG. 3 is referred to as a back-side illuminated (BSI) image sensor, but the present disclosure is not limited thereto. In some other embodiments, the solid-state image sensor may be a front-side illuminated (FSI) image sensor. The semiconductor substrate 101 and the wiring layer 105 shown in FIG. 2 and FIG. 3 may be inverted for FSI image sensor. In the FSI image sensor, incident lights radiate onto the side of the front surface 101F, pass through the wiring layer 105 and then are received by the photoelectric conversion elements 103 formed on the back surface 101B of the semiconductor substrate 101.

As shown in FIG. 2 and FIG. 3, in some embodiments, the solid-state image sensor 10 may also include a high dielectric-constant (high-K) film 107 formed on the back surface 101B of the semiconductor substrate 101 and covering the photoelectric conversion elements 103. The material of the high-κ film 107 may include hafnium oxide ($HfO_2$), hafnium tantalum oxide (HfTaO), hafnium titanium oxide (HMO), hafnium zirconium oxide (HfZrO), tantalum pentoxide ($Ta_2O_5$), other suitable high-κ dielectric materials, or a combination thereof, but the present disclosure is not limited thereto. The high-κ film 107 may be formed by a deposition process. The deposition process is, for example, chemical vapor deposition (CVD), plasma enhanced chemical vapor deposition (PECVD), atomic layer deposition (ALD), or another deposition technique. The high-κ film 107 may have a high-refractive index and a light-absorbing ability.

As shown in FIG. 2 and FIG. 3, in some embodiments, the solid-state image sensor 10 may further include a buffer layer 109 formed on the high-κ film 107. The material of the buffer layer 109 may include silicon oxides, silicon nitrides, silicon oxynitrides, other suitable insulating materials, or a combination thereof, but the present disclosure is not limited thereto. The buffer layer 109 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

Referring to FIG. 1 to FIG. 3, the solid-state image sensor 10 includes a first color filter layer and a second color filter layer disposed above the photoelectric conversion elements 103. In more detail, the first color filter layer has a plurality of first color filter segments, and the second color filter layer has a plurality of second color filter segments. In some embodiments, the first color filter layer may be green (G) color filter layer, which will be referred to as green color filter layer 115G. That is, the first color filter segments may be green color filter segments, which will be referred to as green color filter segments 115GS. Moreover, the second color filter layer may be blue (B) color filter, which will be referred to as blue color filter layer 115B. That is, the second color filter segments may be blue color filter segments, which will be referred to as blue color filter segments 115BS. In the embodiment show in FIG. 1 to FIG. 3, the second color filter layer (i.e., the blue color filter layer 115B) is disposed adjacent to the first color filter layer (i.e., the green color filter layer 115G), but the present disclosure is not limited thereto.

In some embodiments, the first color filter layer may be one of green color filter layer 115G, red color filter layer 115R, and blue color filter layer 115B, while the second color filter layer may be another of green color filter layer 115G, red color filter layer 115R, and blue color filter layer 115B, but the present disclosure is not limited thereto. In some other embodiments, the first color filter layer or the second color filter layer may be white color filter layer.

In some embodiments, the solid-state image sensor 10 may include a plurality of metal grids 111 formed on the buffer layer 109 as shown in FIG. 2 and FIG. 3, but the present disclosure is not limited thereto. In some embodiments, the material of the metal grid 111 may include tungsten (W), aluminum (Al), metal nitride (e.g., titanium nitride (TiN)), other suitable materials, or a combination thereof, but the present disclosure is not limited thereto. The metal grid 111 may be formed by depositing a metal layer on the buffer layer 109 and then patterning the metal layer using photolithography and etching processes to form a grid structure, but the present disclosure is not limited thereto.

Referring to FIG. 1 to FIG. 3, the solid-state image sensor 10 also includes a first grid structure 121 and a second grid structure 123. The first grid structure 121 is disposed between the first color filter layer and the second color filter layer, and the second grid structure 123 is disposed between the first color filter segments and between the second color filter segments. That is, the first grid structure 121 may be disposed between the green color filter layer 115G and the blue color filter layer 115B, and the second grid structure 123 may be disposed between the green color filter segments 115GS and between the blue color filter segments 115BS as shown in FIG. 2. Moreover, the first grid structure 121 may also be disposed between the green color filter layer 115G and the red color filter layer 115R, and the second grid structure 123 may also be disposed between the red color filter segments 115RS as shown in FIG. 3.

In some embodiments, the material of the first grid structure 121 and the material of the second grid structure 123 may include a transparent dielectric material that has a low refractive index in a range from about 1.0 to about 1.99. Moreover, in some embodiments, the refractive index of the first grid structure 121 and the refractive index of the second grid structure 123 are lower than refractive index of the first color filter layer and the refractive index of the second color filter layer.

As shown in FIG. 2 and FIG. 3, the first grid structure 121 has a first grid height H1, the second grid structure 123 has a second grid height H2. In the embodiments of the present disclosure, the second grid height H2 is lower than the first grid height H1.

Compared with traditional grid structures with a constant grid height, the solid-state image sensor 10 in the embodiments of the present disclosure includes the first grid structure 121 and the second grid structure 123 that have different grid heights, which may prevent the grid structures from generating diffraction, thereby improving the quality of the image signal from the photoelectric conversion elements 103 of the solid-state image sensor 10.

As shown in FIG. 2 and FIG. 3, the height HG of the green color filter layer 115G, the height HB of the blue color filter layer 115B, and the height HR of the red color filter layer 115R are each lower than the first grid height H1 of the first grid structure 121, meaning that the green color filter layer 115G, the blue color filter layer 115B and the red color filter layer 115R may not be mixed, thereby preventing crosstalk in the solid-state image sensor 10.

In this embodiment, the height HG of the green color filter layer 115G is higher than the second grid height H2 of the second grid structure 123 as shown in FIG. 2 and FIG. 3, the height HB of the blue color filter layer 115B is lower than the second grid height H2 of the second grid structure 123 as shown in FIG. 2, and the height HR of the red color filter layer 115R is higher than the second grid height H2 of the second grid structure 123 as shown in FIG. 3, but the present disclosure is not limited thereto. In some other embodiments, the height HB of the blue color filter layer 115B may also be higher than or equal to the second grid height H2 of the second grid structure 123, and the height HG of the green color filter layer 115G and the height HR of the red color filter layer 115R may also be lower than or equal to the second grid height H2 of the second grid structure 123.

Moreover, although the height HG of the green color filter layer 115G is illustrated as being equal to the height HR of the red color filter layer 115R in FIG. 3, the present disclosure is not limited thereto. The height HG of the green color filter layer 115G, the height HB of the blue color filter layer 115B, and the height HR of the red color filter layer 115R may be adjusted as required (e.g., to improve the quality of the signal received by the photoelectric conversion elements 103).

Furthermore, although the second grid height H2 of the second grid structure 123 is illustrated as being constant in FIG. 2 and FIG. 3, the present disclosure is not limited thereto. In some embodiments, the second grid height H2 of the second grid structure 123 may be variable. For example, the second grid height H2 of the second grid structure 123 corresponding to the central area of the solid-state image sensor 10 may be different from the second grid height H2 of the second grid structure 123 corresponding to the edge area of the solid-state image sensor 10 for better quality of signal received by the photoelectric conversion elements 103, but the present disclosure is not limited thereto.

In the cross-sectional view of the solid-state image sensor 10 in FIG. 2 and FIG. 3, the first grid structure 121 may include (or may be referred to) a plurality of first grid segments 121S, and the second grid structure 123 may include (or may be referred to) a plurality of second grid segments 123S. As shown in FIG. 2 and FIG. 3, in some embodiments, the distance P1 between two adjacent first grid segments 121S is different from the distance P2 between two adjacent second grid segments 123S, but the present disclosure is not limited thereto. In some other embodiments, the distance P1 between two adjacent first grid segments 121S may be equal to or close to the distance P2 between two adjacent second grid segments 123S.

Similarly, the distance P2 between two adjacent second grid segments 123S may be variable. For example, the distance P2 between two adjacent second grid segments 123S corresponding to the central area of the solid-state image sensor 10 may be different from the distance P2 between two adjacent second grid segments 123S corresponding to the edge area of the solid-state image sensor 10. That is, the second grid segments 123S of the second grid structure 123 may have extra-shift for better quality of signal received by the photoelectric conversion elements 103, but the present disclosure is not limited thereto.

As shown in FIG. 2 and FIG. 3, in some embodiments, the solid-state image sensor may further include a plurality of condensing structures 119 disposed on the color filter layers (e.g., green color filter layers 115G, blue color filter layers 115B or red color filter layers 115R) for condensing incident light. In some embodiments, the material of the condensing structure 109 may be a transparent material. For example, the material of the condensing structure 109 may include glass, epoxy resin, silicone resin, polyurethane, any other applicable material, or a combination thereof, but the present disclosure is not limited thereto. In some embodiments, the condensing structure 109 may be formed by a photoresist reflow method, a hot embossing method, any other applicable method, or a combination thereof. In some embodiments, the steps of forming the condensing structure 109 may include a spin coating process, a lithography process, an etching process, any other applicable process, or a combination thereof, but the present disclosure is not limited thereto.

In some embodiment, the condensing structure 109 may be a micro-lens structure, such a semi-convex lens or a convex lens, but the present disclosure is not limited thereto. In some other embodiments, the condensing structure 109 may be micro-pyramid structures (e.g., circular cone, quadrangular pyramid, and so on), or may be micro-trapezoidal structures (e.g., flat top cone, truncated square pyramid, and so on). Alternatively, the condensing structure 109 may be a gradient-index structure.

In the embodiment shown in FIG. 2 and FIG. 3, each of the condensing structures 119 corresponds to one of the green color filter segments 115GS, one of the blue color filter segments 115BS, or one of the red color filter segments 115RS, but the present disclosure is not limited thereto. In other embodiments (such as the following FIG. 10), each of the condensing structures 119 may correspond to at least two green color filter segments 115GS, at least two blue color filter segments 115BS, or at least two red color filter segments 115RS.

In some embodiments, in the top view of the solid-state image sensor 10 (e.g., FIG. 1), the first grid structure 121 defines a plurality of sensing areas. Each of the sensing areas includes $x^2$ first color filter segments or $x^2$ second color filter segments, wherein x is a positive integer that is greater than or equal to 2. For example, the first grid structure 121 may defines a plurality of sensing areas S in FIG. 1, and each of the sensing areas S may include four ($2^2$) green color filter segments 115GS, four ($2^2$) blue color filter segments 115BS, or four ($2^2$) red color filter segments 115RS, but the present disclosure is not limited thereto.

Figure 4:
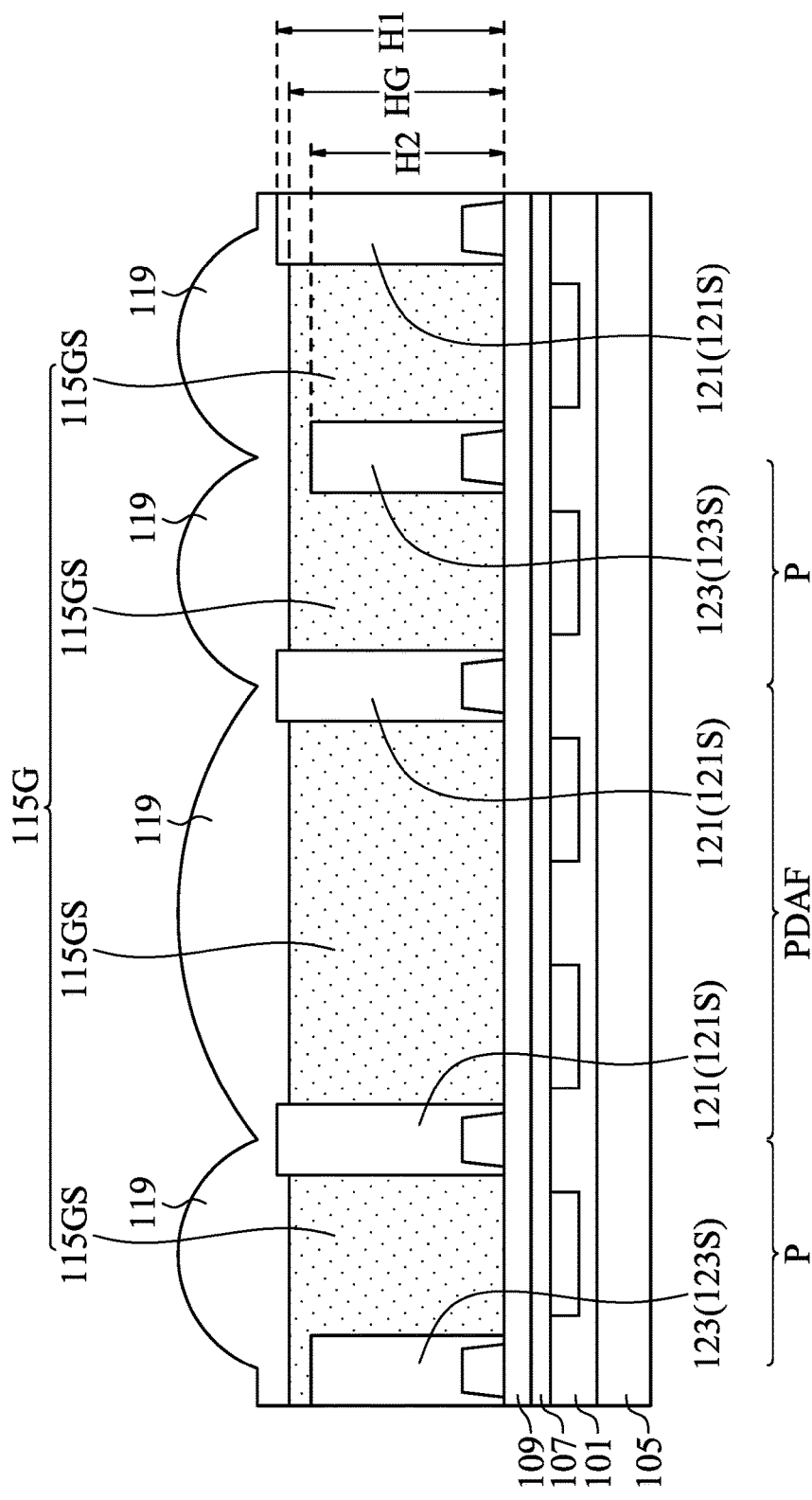
FIG. 4 is a cross-sectional view of a solid-state image sensor according to another embodiment of the disclosure.
Figure 5:
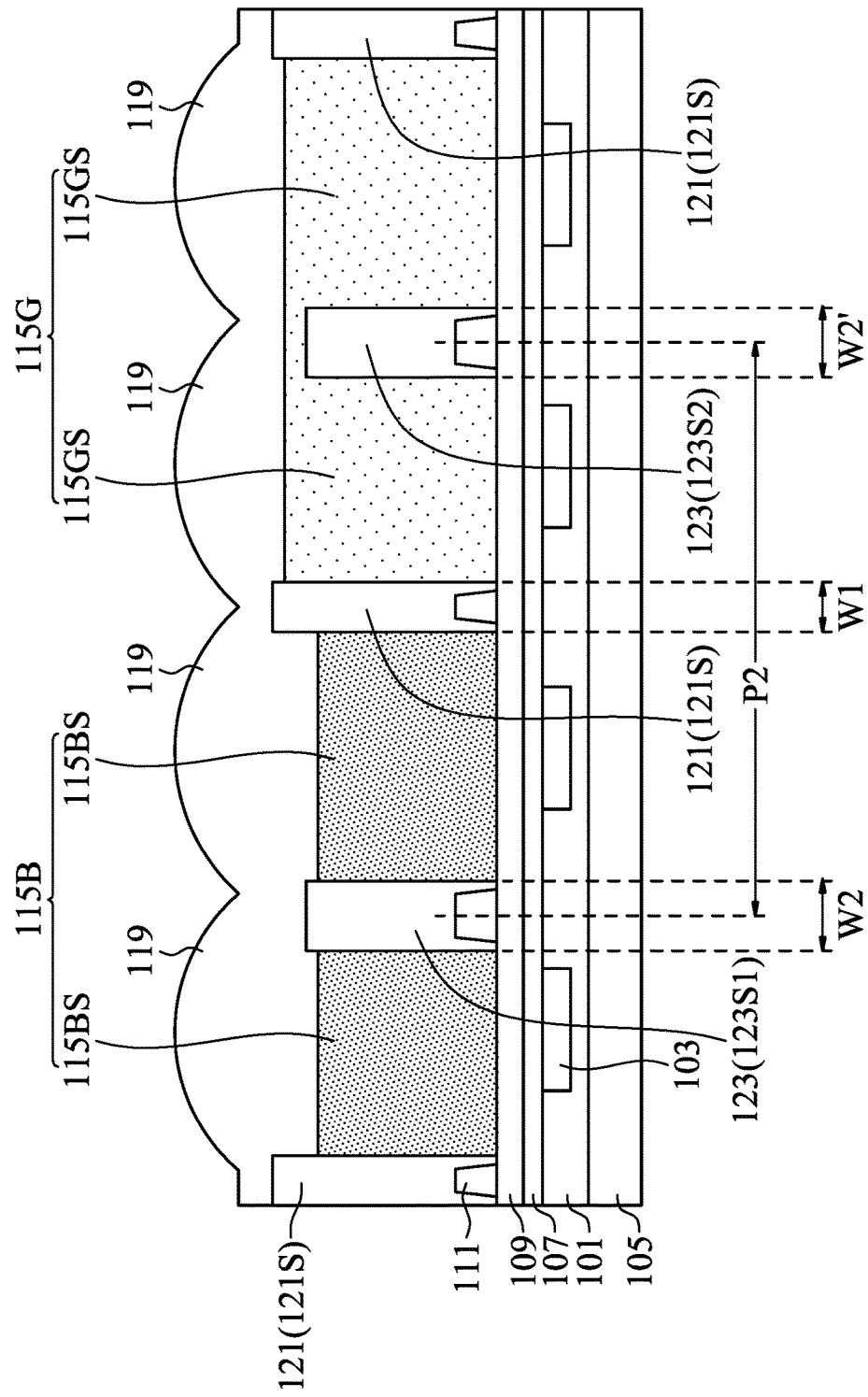
FIG. 5 is a cross-sectional view of a portion of solid-state image sensor according to still another embodiment of the disclosure.
Figure 6:
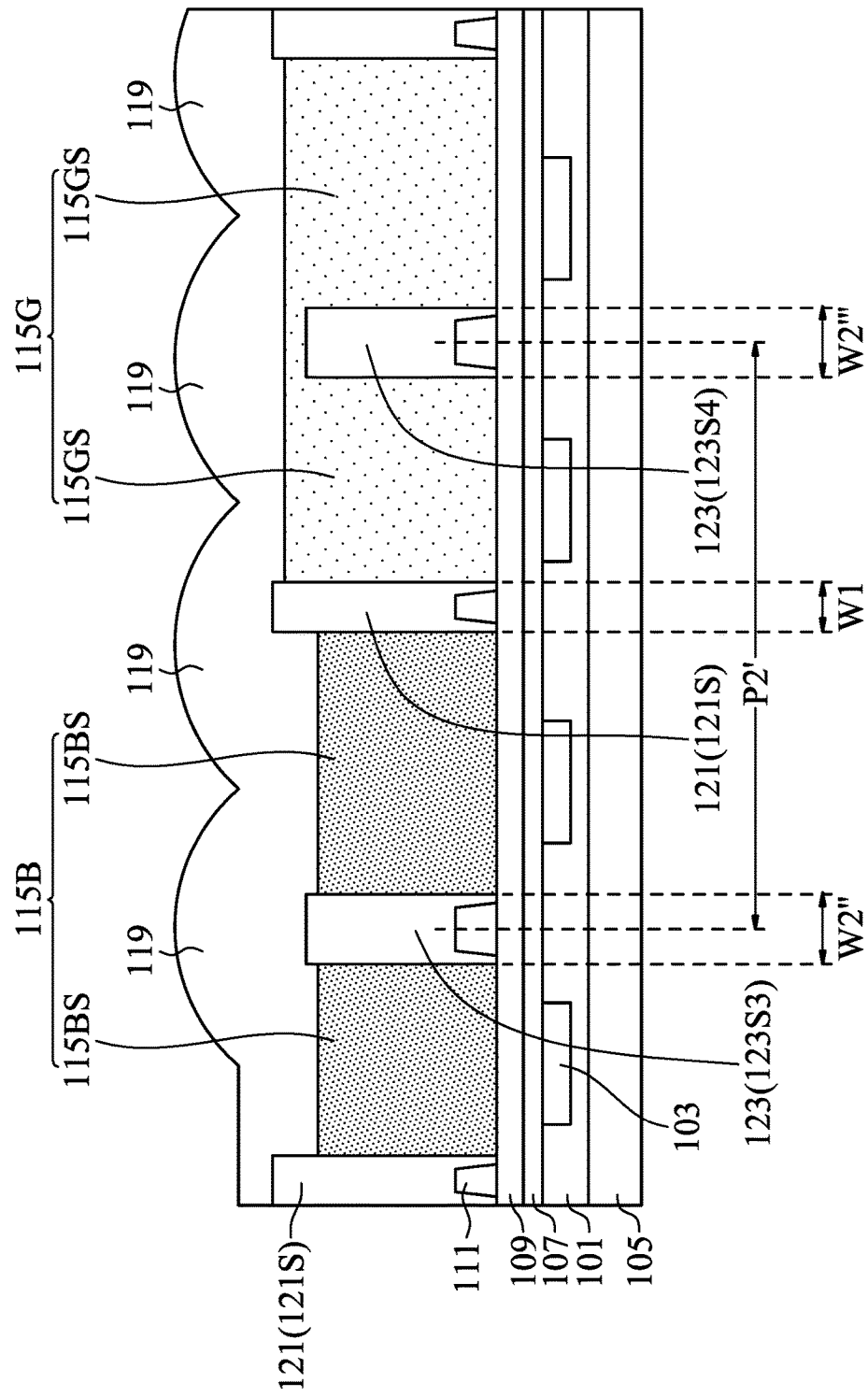
FIG. 6 is a cross-sectional view of another portion of the solid-state image sensor.

FIG. 4 is a cross-sectional view of a solid-state image sensor 12 according to another embodiment of the disclosure. FIG. 5 is a cross-sectional view of a portion of solid-state image sensor 14 according to still another embodiment of the disclosure. FIG. 6 is a cross-sectional view of another portion of the solid-state image sensor 14. Similarly, some components of the solid-state image sensor 12 and some components of the solid-state image sensor 14 may be omitted in FIG. 4 to FIG. 6 for the sake of brevity.

Referring to FIG. 4, the solid-state image sensor 12 includes a plurality of photoelectric conversion elements 103. The solid-state image sensor 12 also includes green color filter layer 115G disposed above the photoelectric conversion elements 103. The green color filter layer 115G has a plurality of green color filter segments 115GS. The solid-state image sensor 12 includes a first grid structure 121 and a second grid structure 123 disposed between the green color filter segments 115GS. The first grid structure 121 (first grid segment 121S) has a first grid height H1, and the second grid structure 123 (second grid segment 123S) has a second grid height H2 that is lower than the first grid height H1.

In this embodiment, the height HG of the green color filter layer 115G (green color filter segment 115GS) is higher than the second grid height H2 of the second grid structure 123 (second grid segment 123S) and lower than the first grid height H1 of the first grid structure 121 (first grid segment 121S), but the present disclosure is not limited thereto. In some other embodiments, the height HG of the green color filter layer 115G (green color filter segment 115GS) may also be lower than or equal to the second grid height H2 of the second grid structure 123 (second grid segment 123S).

As shown in FIG. 4, the photoelectric conversion elements 103 may be arranged in a plurality of normal pixels P and a plurality of phase detection auto focus pixels PDAD surrounded by the normal pixels P, but the present disclosure is not limited thereto. Furthermore, the green color filter layer 115G (green color filter segment 115GS) in FIG. 4 may be replaced with the blue color filter layer 115B (blue color filter segment 115BS), the red color filter layer 115R (red color filter segment 115RS), or other color filter layers.

Referring to FIG. 5, the solid-state image sensor 14 may have similar structure to the solid-state image sensor 10 shown in FIG. 1 to FIG. 3. The difference from the solid-state image sensor 10 is that the first grid structure 121 (first grid segment 121S) of the solid-state image sensor 14 has a first grid width W1, the second grid structure 123 (second grid segment 123S) of the solid-state image sensor 14 has a second grid width W2 (or W2'), and the second grid width W2 (or W2') may be different from the first grid width W1.

For example, the first grid segment 121S has the first grid width W1, the second grid segment 123S1 between the blue color filter segments 115BS has the second grid width W2, and the second grid segment 123S2 between the green color filter segments 115GS has the second grid width W2' as shown in FIG. 5. In this embodiment, the second grid width W2 of the second grid segment 123S1 and the second grid width W2' of the second grid segment 123S2 are each greater than the first grid width W1 of the first grid segment 121S, but the present disclosure is not limited thereto.

Moreover, the second grid width W2 of the second grid segment 123S1 and the second grid width W2' of the second grid segment 123S2 may be the same or different, as required.

FIG. 5 may be the cross-sectional view corresponding to the central area of the solid-state image sensor 14, and FIG. 6 may be the cross-sectional view corresponding to the edge area of the solid-state image sensor 14. Compared with the condensing structures 119 shown in FIG. 5, the position of the green color filter layer 115G (green color filter segment 115GS), the position of the blue color filter layer 115B (blue color filter segment 115BS), and the position of the condensing structures 119 corresponding to the green color filter layer 115G (green color filter segment 115GS) and the blue color filter layer 115B (blue color filter segment 115BS) shown in FIG. 6 may be shifted, such that the brightness of the same color (e.g., green, blue, or red) received by the photoelectric conversion elements 103 in different areas (e.g., central area and edge area) of the solid-state image sensor 14 may be more uniform.

In some embodiments, the second grid width W2 of the second grid segment 123S1, the second grid width W2' of the second grid segment 123S2 shown in FIG. 5, the second grid width W2" of the second grid segment 123S3, and the second grid width W2'" of the second grid segment 123S4 shown in FIG. 6 may all be the same or different, as required.

Furthermore, in some embodiments, the distance between two adjacent second grid segments 123S may be variable. For example, the distance P2 between adjacent second grid segment 123S1 and second grid segment 123S2 in FIG. 5 (which may correspond to the central area of the solid-state image sensor 14) may be different from the distance P2' between adjacent second grid segment 123S3 and second grid segment 123S4 in FIG. 6 (which may correspond to the edge area of the solid-state image sensor 14). That is, the second grid segment 123 S3 and the second grid segment 123S4 of the second grid structure 123 may have extra-shift for better quality of signal received by the photoelectric conversion elements 103, but the present disclosure is not limited thereto.

Figure 7:
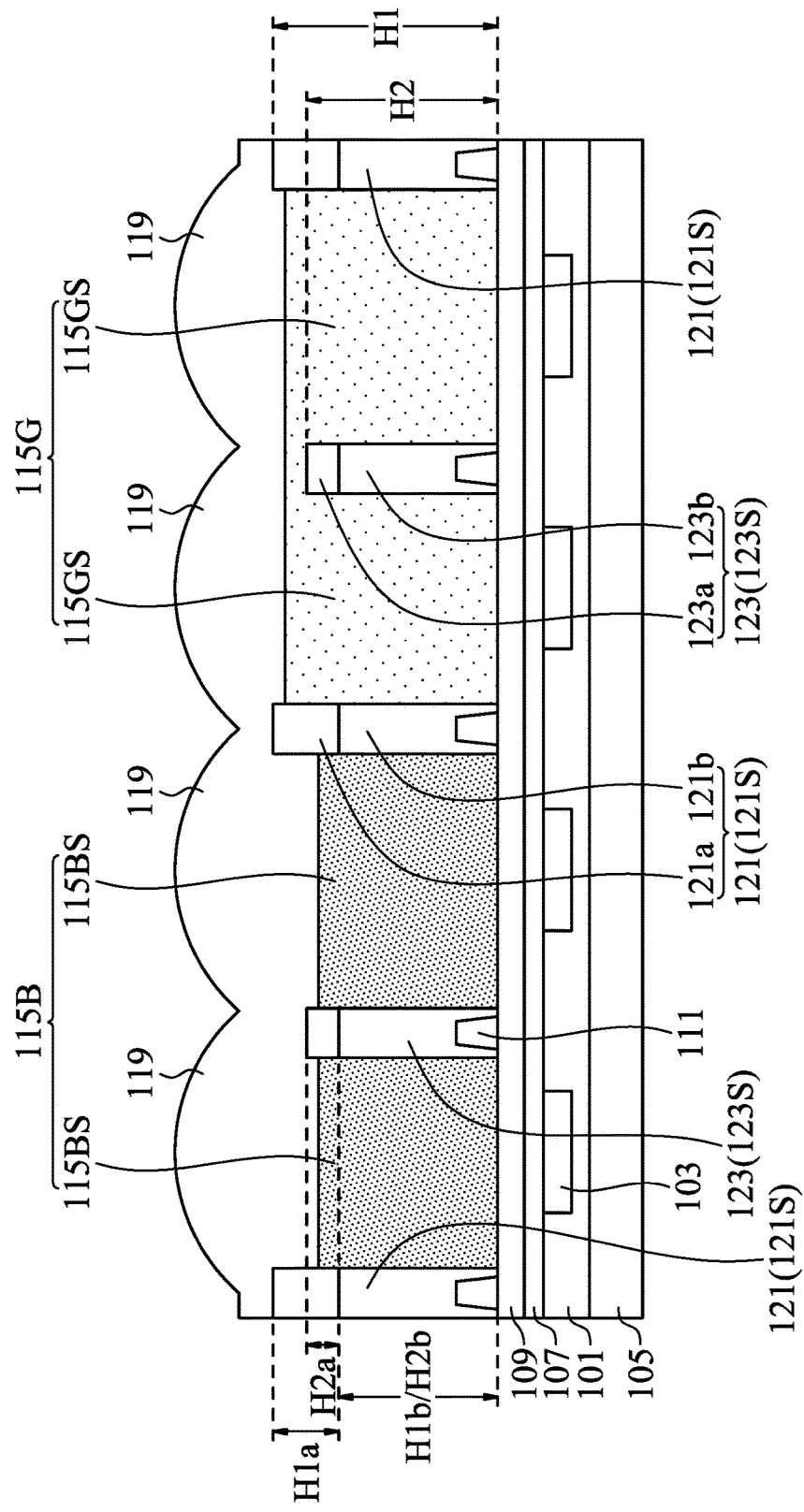
FIG. 7 is a cross-sectional view of a solid-state image sensor according to one embodiment of the disclosure.
Figure 8:
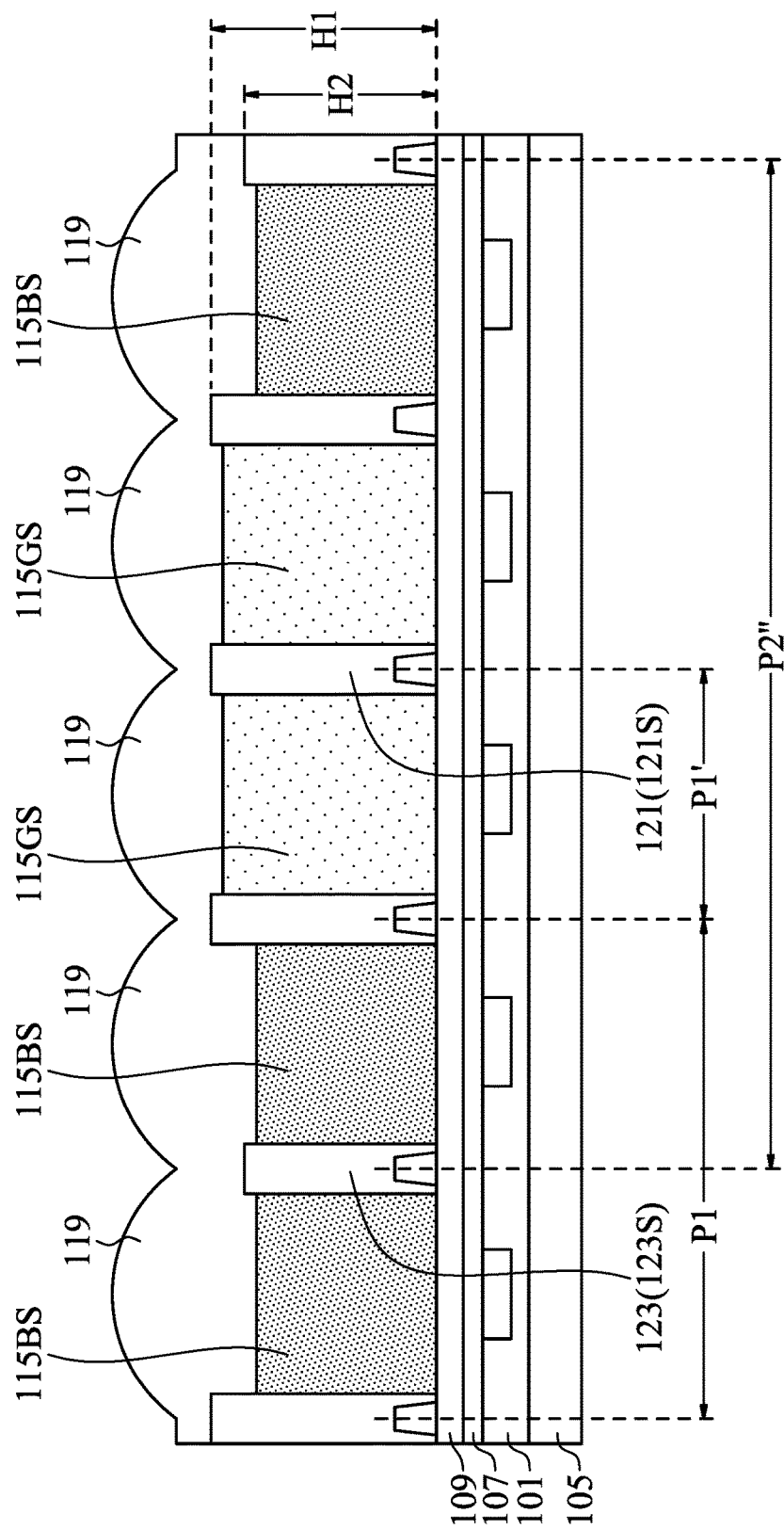
FIG. 8 is a cross-sectional view of a solid-state image sensor according to another embodiment of the disclosure.
Figure 9:
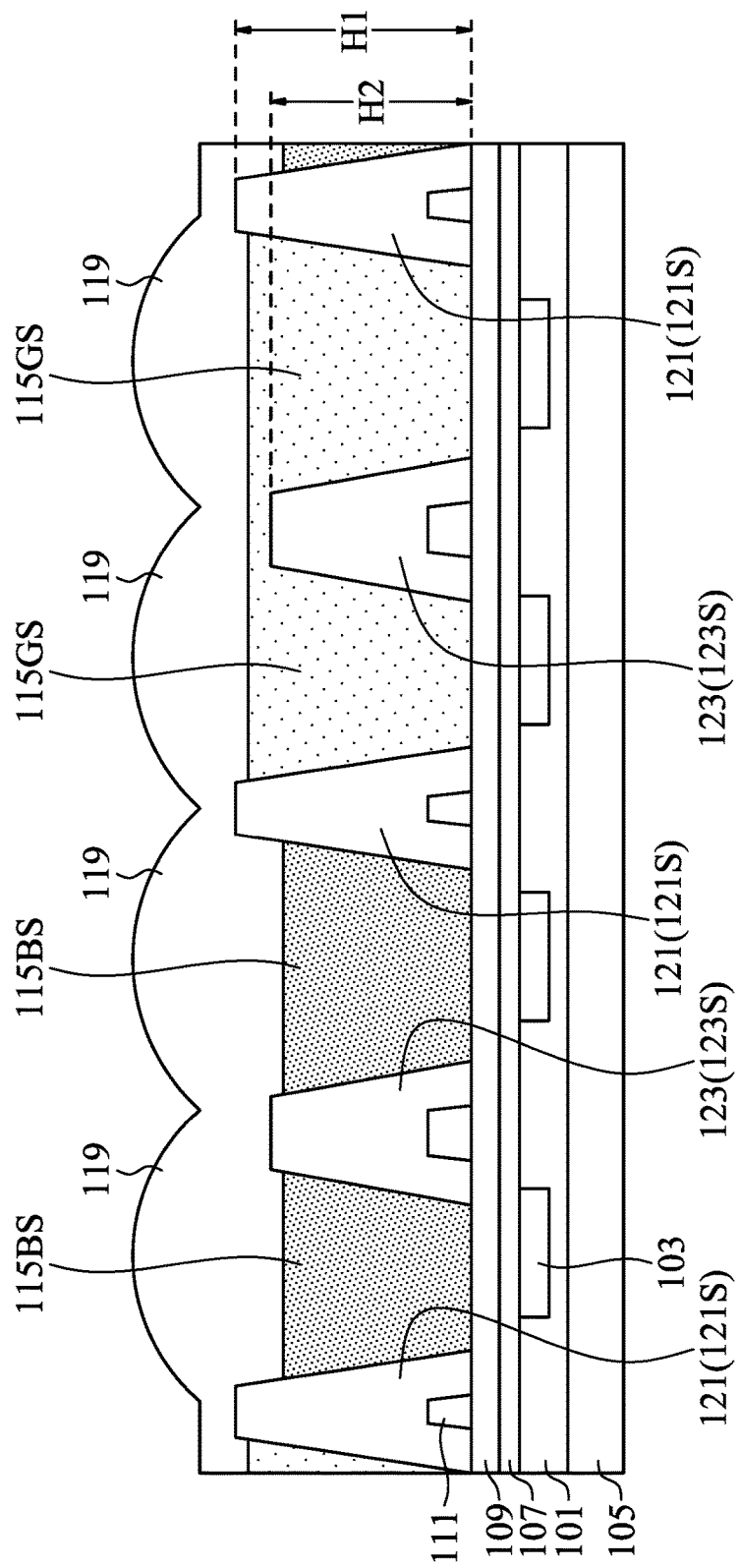
FIG. 9 is a cross-sectional view of a solid-state image sensor according to still another embodiment of the disclosure.

FIG. 7 is a cross-sectional view of a solid-state image sensor 16 according to one embodiment of the disclosure. FIG. 8 is a cross-sectional view of a solid-state image sensor 18 according to another embodiment of the disclosure. FIG. 9 is a cross-sectional view of a solid-state image sensor 20 according to still another embodiment of the disclosure. Similarly, some components of the solid-state image sensor 16, some components of the solid-state image sensor 18, and some components of the solid-state image sensor 20 may be omitted in FIG. 7 to FIG. 9 for the sake of brevity.

Referring to FIG. 7, the solid-state image sensor 16 may have similar structure to the solid-state image sensor 10 shown in FIG. 1 to FIG. 3. The difference from the solid-state image sensor 10 is that the first grid structure 121 (first grid segment 121S) of the solid-state image sensor 16 includes a first base portion 121*b* and a first additional portion 121*a* disposed on the first base portion 121*b*, and the second grid structure 123 (second grid segment 123S) includes a second base portion 123*b* and a second additional portion 123*a* disposed on the second base portion 123*b*.

As shown in FIG. 7, in some embodiments, the height H1*b* of the first base portion 121*b* may be equal to the height H2*b* of the second base portion 123*b*, and the height H1*a* of the first additional portion 121*a* may be higher than the height H2*a* of the second additional portion 123*a*, such that the second grid height H2 of the second grid structure 123 (second grid segment 123S) may be lower than the first grid height H1 of the first grid structure 121 (first grid segment 121S), but the present disclosure is not limited thereto.

In some embodiments, the material of the first base portion 121*b* of the first grid structure 121 may be the same as the material of the second base portion 123*b* of the second grid structure 123, and the material of the first additional portion 121*a* of the first grid structure 121 may be the same as the material of the second additional portion 123*a* of the second base portion 123*b*, but the present disclosure is not limited thereto.

Referring to FIG. 8, the solid-state image sensor 18 may have similar structure to the solid-state image sensor 10 shown in FIG. 1 to FIG. 3. The difference from the solid-state image sensor 10 is that the first grid structure 121 (first grid segment 121S) of the solid-state image sensor 18 may also be disposed between green color filter segments 115GS, but the present disclosure is not limited thereto. In some other embodiments, the first grid structure 121 (first grid segment 121S) may also be disposed between blue color filter segments 115BS, red color filter segments 115RS, or other color filter segments. That is, some first grid segments 121S of the first grid structure 121 may be disposed between two color filter segments of the same color.

As shown in FIG. 8, the distance between two adjacent first grid segments 121S may also be variable (e.g., P1 and P1'). In this embodiment, the distance P2" between two adjacent second grid segments 123S may be longer than the distance P1 or P1' between two adjacent first grid segments 121S, and it may be longer than the distance P2 between two adjacent second grid segments 123S shown in FIG. 2 or FIG. 3, but the present disclosure is not limited thereto.

In the foregoing embodiments, the first grid structure 121 (first grid segment 121S) or the second grid structure 123 (second grid segment 123S) is illustrated as being rectangular in the cross-sectional view of the solid-state image sensor, but the present disclosure is not limited thereto. Referring to FIG. 9, in the cross-sectional view of the solid-state image sensor 20, the first grid structure 121 (first grid segment 121S) may be formed as a trapezoid, and the second grid structure 123 (second grid segment 123S) may be formed as a trapezoid. That is, the width of the top of the first grid segment 121S of the first grid structure 121 may be less than the width of the bottom of the first grid segment 121S of the first grid structure 121, and the width of the top of the second grid segment 123S of the second grid structure 123 may be less than the width of the bottom of the second grid segment 123S of the second grid structure 123, but the present disclosure is not limited thereto.

Figure 10:
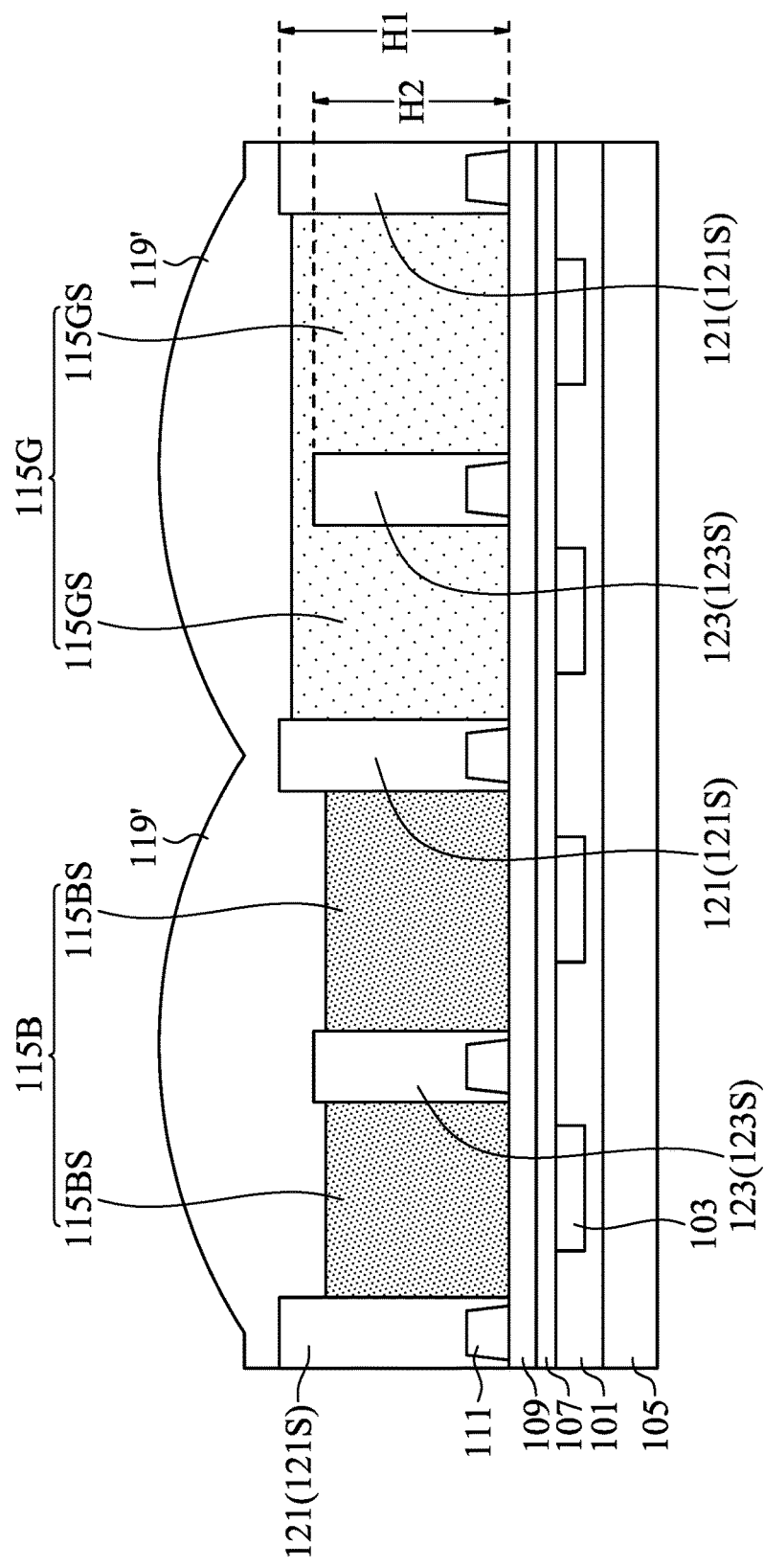
FIG. 10 is a cross-sectional view of a solid-state image sensor according to one embodiment of the disclosure.

FIG. 10 is a cross-sectional view of a solid-state image sensor 22 according to one embodiment of the disclosure. Referring to FIG. 10, the solid-state image sensor 22 may have similar structure to the solid-state image sensor 10 shown in FIG. 1 to FIG. 3. The difference from the solid-state image sensor 10 is that each of the condensing structures 119' corresponds to two green color filter segments 115GS and two blue color filter segments 115BS, but the present disclosure is not limited thereto. In some other embodiments, each of the condensing structures 119' may correspond to red color filter segments or other color filter segments, and the number of color filter segments to which each of the condensing structures 119' corresponds may be two or more.

Figure 11:
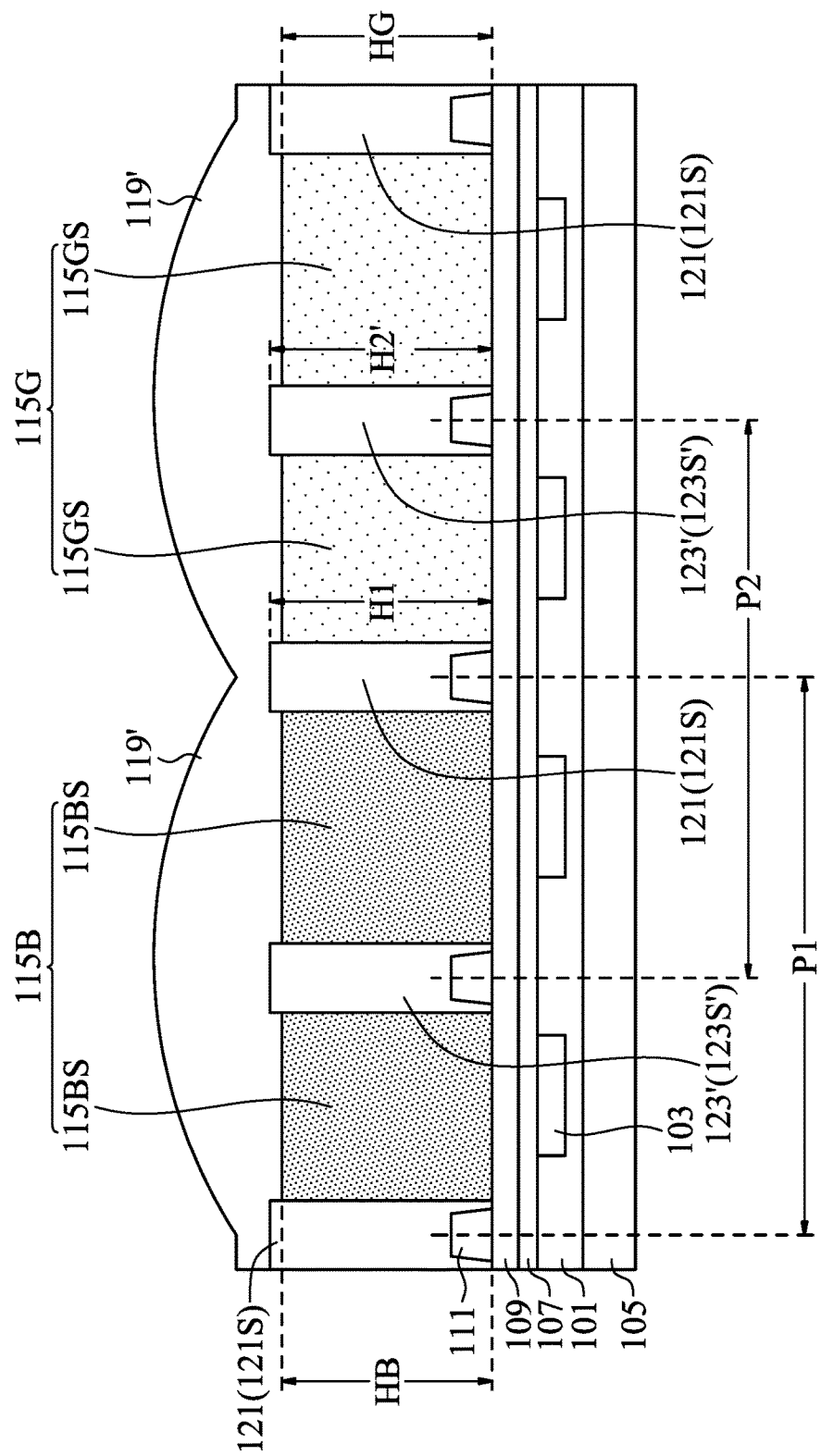
FIG. 11 is a cross-sectional view of a portion of solid-state image sensor according to another embodiment of the disclosure.
Figure 12:
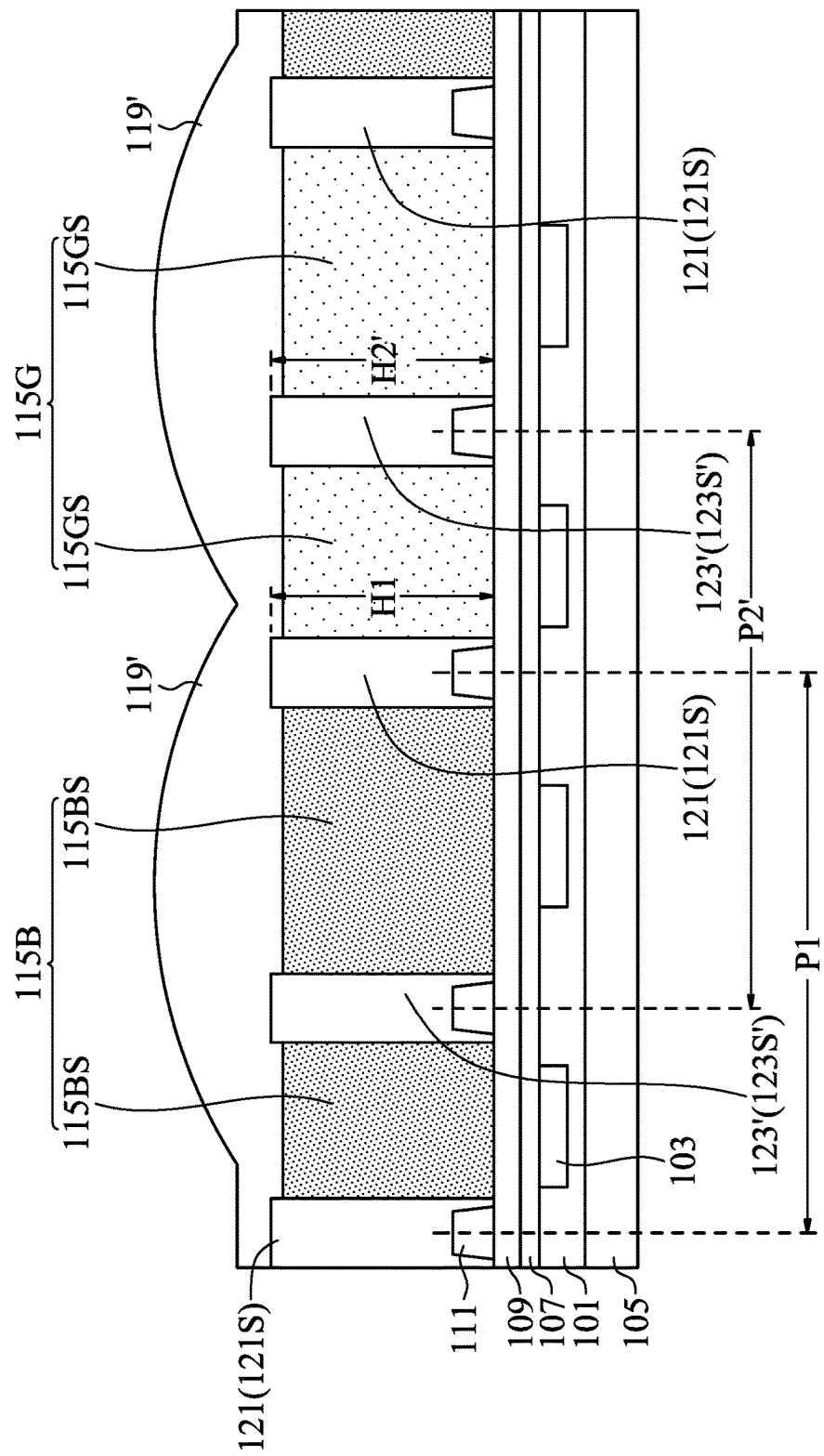
FIG. 12 is a cross-sectional view of another portion of the solid-state image sensor.

FIG. 11 is a cross-sectional view of a portion of solid-state image sensor 24 according to another embodiment of the disclosure. FIG. 12 is a cross-sectional view of another portion of the solid-state image sensor 24. For example, FIG. 11 may be the cross-sectional view corresponding to the central area of the solid-state image sensor 24, and FIG. 12 may be the cross-sectional view corresponding to the edge area of the solid-state image sensor 24.

Referring to FIG. 11 and FIG. 12, the solid-state image sensor 24 may have similar structure to the solid-state image sensor 22 shown in FIG. 10. That is, each of the condensing structures 119' corresponds to at least two green color filter segments 115GS and at least two blue color filter segments 115BS, but the present disclosure is not limited thereto. In some other embodiments, each of the condensing structures 119' may correspond to red color filter segments or other color filter segments, and the number of color filter segments to which each of the condensing structures 119' corresponds may be two or more.

The difference from the solid-state image sensor 22 is that in the solid-state image sensor 24 shown in FIG. 11 and FIG. 12, the second grid height H2' of the second grid structure 123' (second grid segments 123S') is equal to the first grid height H1 of the first grid structure 121. Similarly, the height HG of the green color filter layer 115G and the height HB of the blue color filter layer 115B may be each lower than the second grid height H2' of the second grid structure 123' (and lower than the first grid height H1 of the first grid structure 121), but the present disclosure is not limited thereto.

Compared with the condensing structures 119' shown in FIG. 11, the position of the green color filter layer 115G (green color filter segment 115GS), the position of the blue color filter layer 115B (blue color filter segment 115BS), and the position of the condensing structures 119' corresponding to the green color filter layer 115G (green color filter segment 115GS) and the blue color filter layer 115B (blue color filter segment 115BS) shown in FIG. 12 may be shifted, such that the brightness of the same color (e.g., green, blue, or red) received by the photoelectric conversion elements 103 in different areas (e.g., central area and edge area) of the solid-state image sensor 24 may be more uniform.

In some embodiments, the distance P1 between two adjacent first grid segments 121S is different from the distance P2 between two adjacent second grid segments 123S', but the present disclosure is not limited thereto. In some other embodiments, the distance P1 between two adjacent first grid segments 121S may be equal to or close to the distance P2 between two adjacent second grid segments 123S'.

Furthermore, in some embodiments, the distance between two adjacent second grid segments 123S' may be variable. For example, the distance P2 between adjacent second grid segments 123S' in FIG. 11 (which may correspond to the central area of the solid-state image sensor 24) may be different from the distance P2' between adjacent second grid segments 123S' in FIG. 12 (which may correspond to the edge area of the solid-state image sensor 24). That is, the second grid segments 123S' in the edge area of the solid-state image sensor 24 may have extra-shift for better quality of signal received by the photoelectric conversion elements 103, but the present disclosure is not limited thereto.

Figure 13:
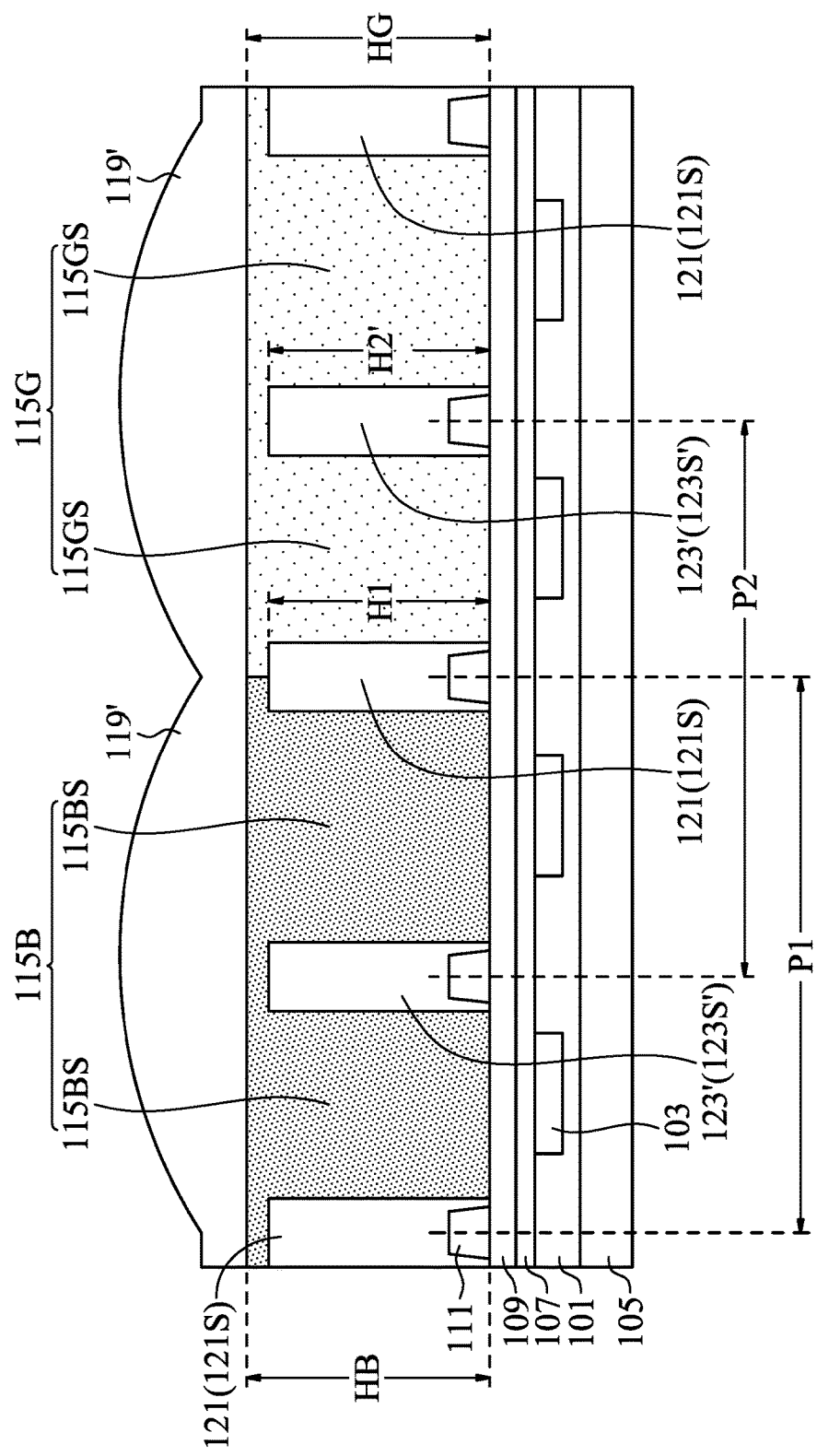
FIG. 13 is a cross-sectional view of a portion of solid-state image sensor according to still another embodiment of the disclosure.
Figure 14:
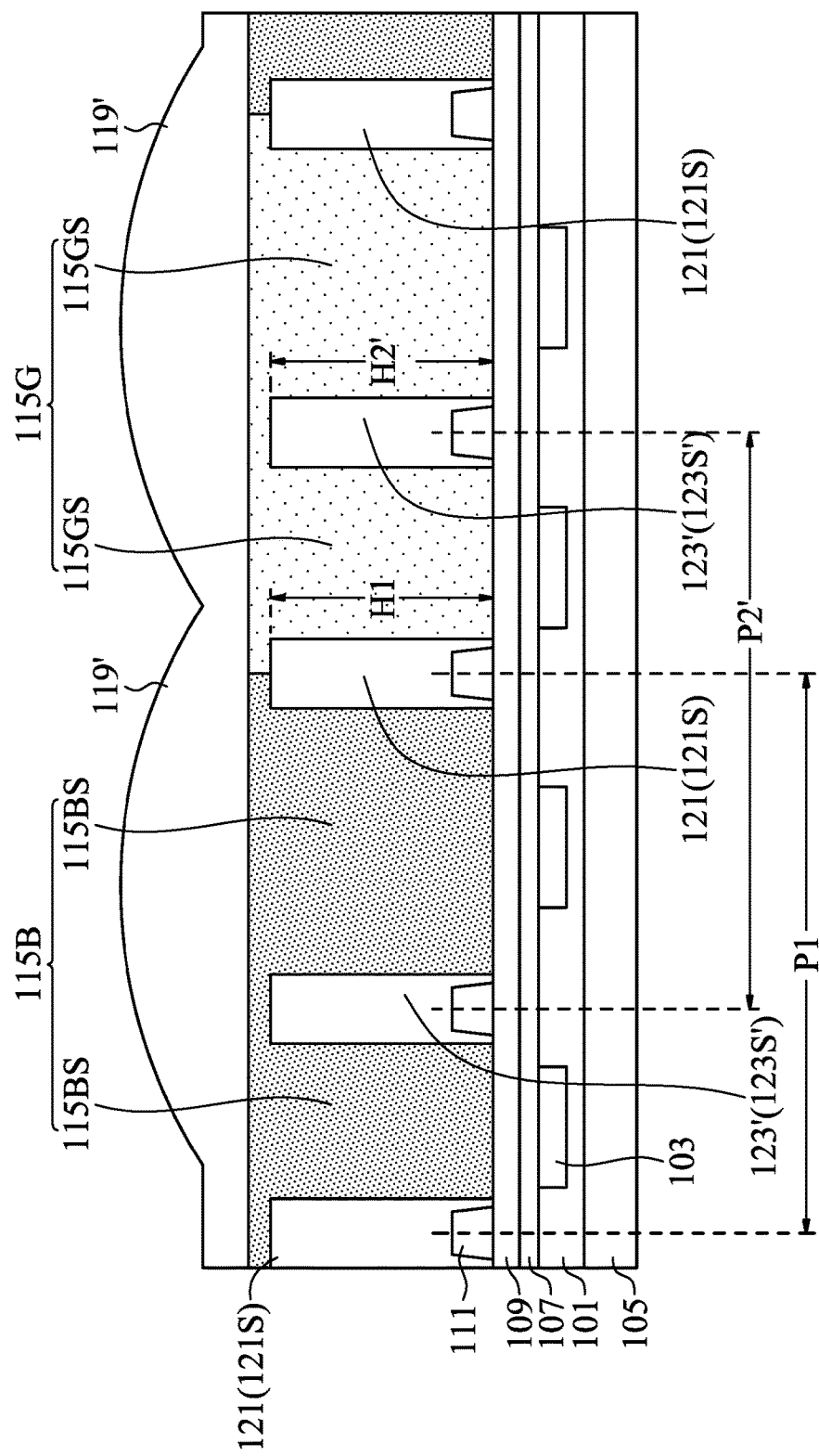
FIG. 14 is a cross-sectional view of another portion of the solid-state image sensor.

FIG. 13 is a cross-sectional view of a portion of solid-state image sensor 26 according to still another embodiment of the disclosure. FIG. 14 is a cross-sectional view of another portion of the solid-state image sensor 26. For example, FIG. 13 may be the cross-sectional view corresponding to the central area of the solid-state image sensor 26, and FIG. 14 may be the cross-sectional view corresponding to the edge area of the solid-state image sensor 26.

Referring to FIG. 13 and FIG. 14, the solid-state image sensor 26 may have similar structure to the solid-state image sensor 24 shown in FIGS. 11 and 12. That is, each of the condensing structures 119' corresponds to at least two green color filter segments 115GS and at least two blue color filter segments 115BS, and the second grid height H2' of the second grid structure 123' (second grid segments 123S') is equal to the first grid height H1 of the first grid structure 121.

The difference from the solid-state image sensor 24 is that in the solid-state image sensor 26 shown in FIG. 13 and FIG. 14, the height HG of the green color filter layer 115G and the height HB of the blue color filter layer 115B may be each higher than the second grid height H2' of the second grid structure 123' (and higher than the first grid height H1 of the first grid structure 121).

Similarly, compared with the condensing structures 119' shown in FIG. 13, the position of the green color filter layer 115G (green color filter segment 115GS), the position of the blue color filter layer 115B (blue color filter segment 115BS), and the position of the condensing structures 119' corresponding to the green color filter layer 115G (green color filter segment 115GS) and the blue color filter layer 115B (blue color filter segment 115BS) shown in FIG. 14 may be shifted, such that the brightness of the same color (e.g., green, blue, or red) received by the photoelectric conversion elements 103 in different areas (e.g., central area and edge area) of the solid-state image sensor 26 may be more uniform.

In some embodiments, the distance P1 between two adjacent first grid segments 121S is different from the distance P2 between two adjacent second grid segments 123S', but the present disclosure is not limited thereto. In some other embodiments, the distance P1 between two adjacent first grid segments 121S may be equal to or close to the distance P2 between two adjacent second grid segments 123S'.

Furthermore, in some embodiments, the distance between two adjacent second grid segments 123S' may be variable. For example, the distance P2 between adjacent second grid segments 123S' in FIG. 13 (which may correspond to the central area of the solid-state image sensor 26) may be different from the distance P2' between adjacent second grid segments 123S' in FIG. 14 (which may correspond to the edge area of the solid-state image sensor 26). That is, the second grid segments 123S' in the edge area of the solid-state image sensor 26 may have extra-shift for better quality of signal received by the photoelectric conversion elements 103, but the present disclosure is not limited thereto.

Figure 15:
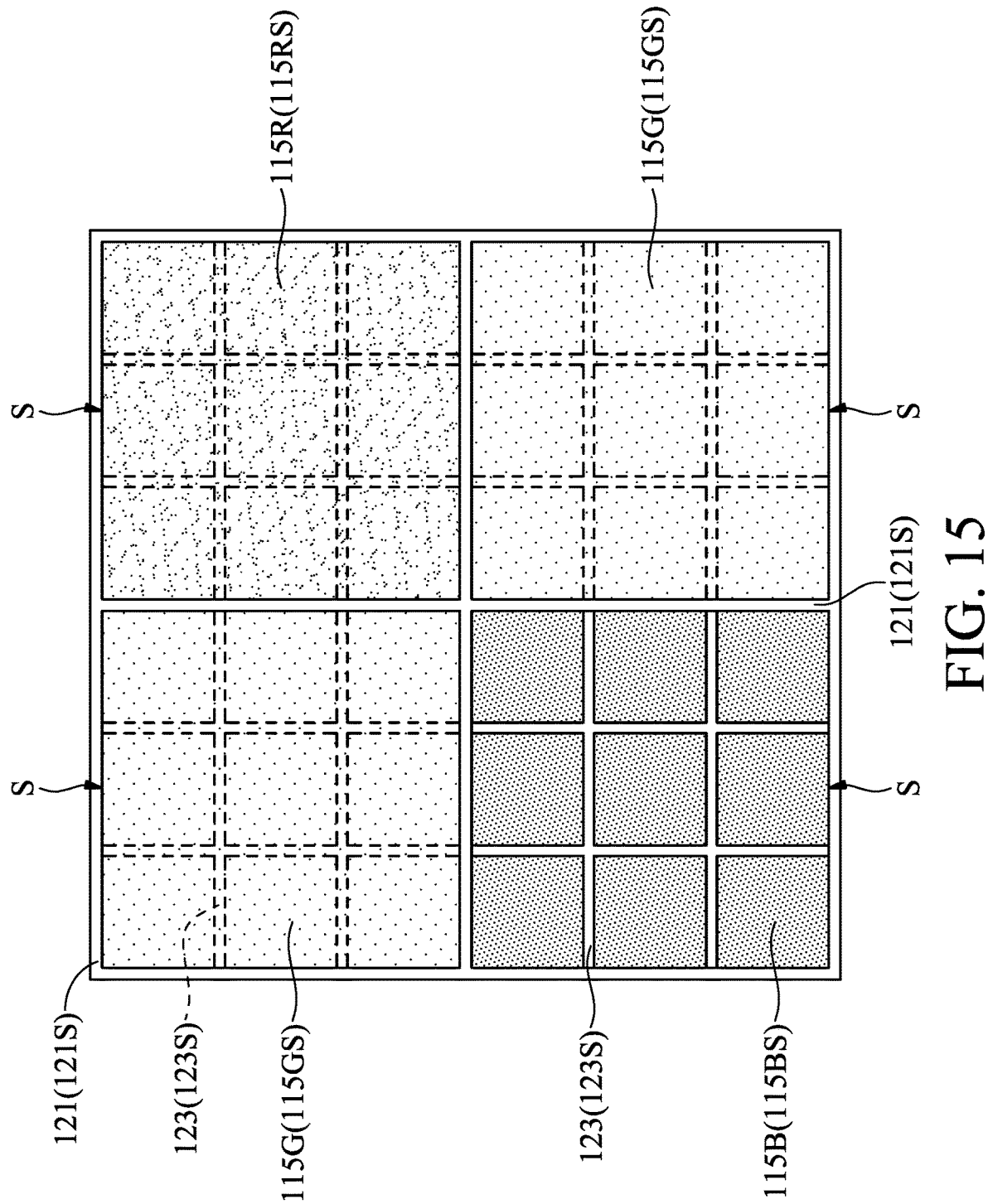
FIG. 15 is a top view illustrating a solid-state image sensor according to one embodiment of the disclosure.
Figure 16:
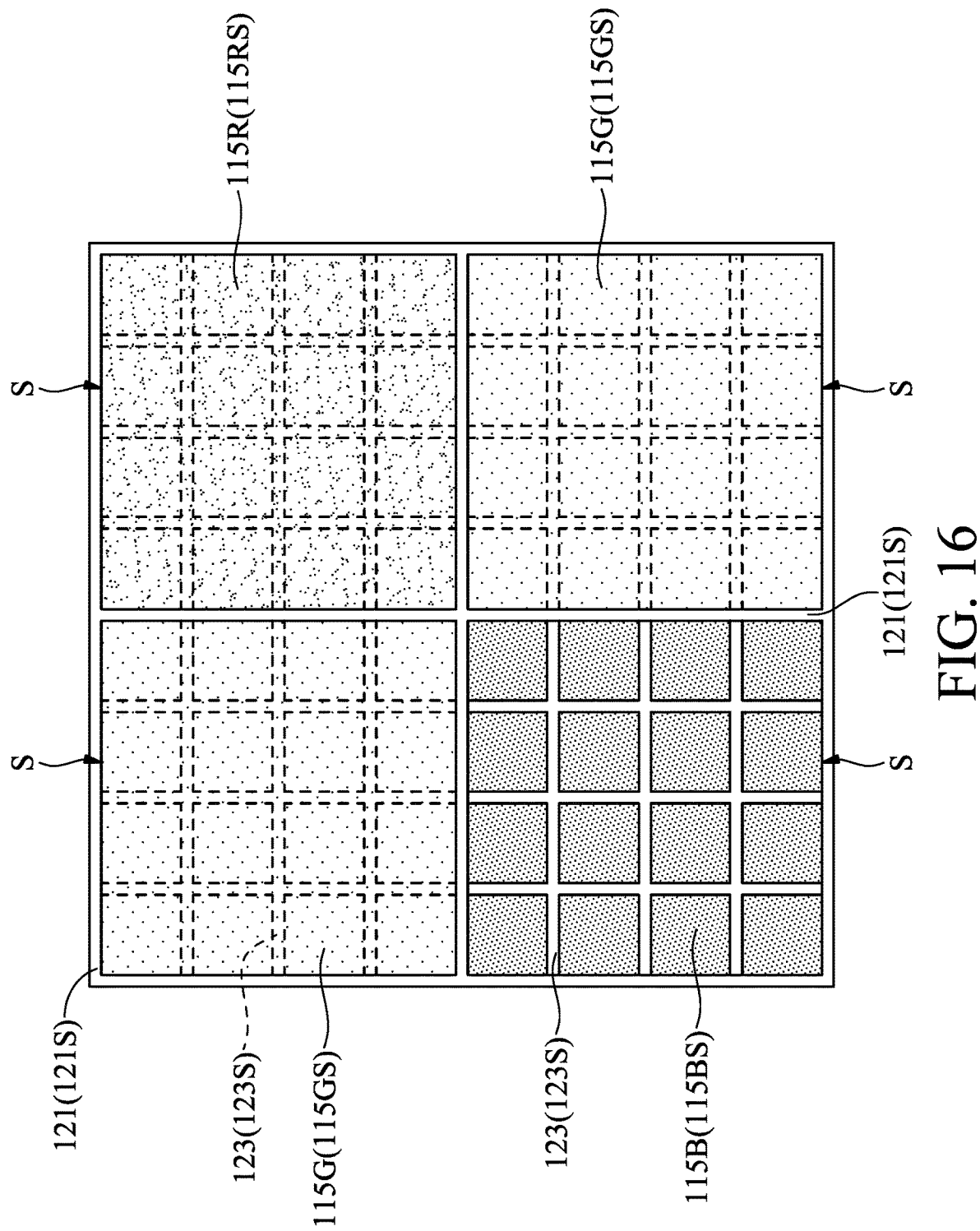
FIG. 16 is a top view illustrating a solid-state image sensor according to another embodiment of the disclosure.
Figure 17:
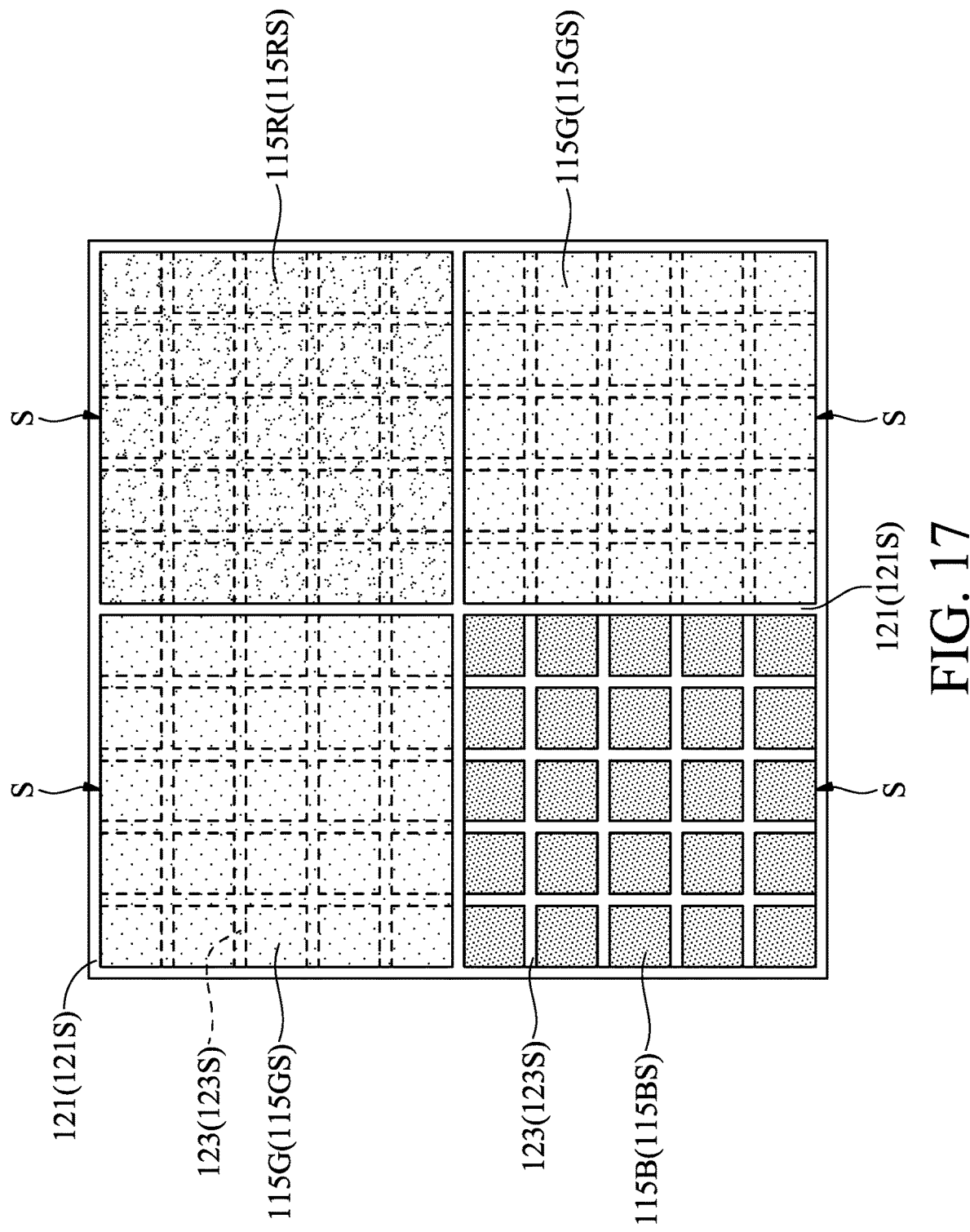
FIG. 17 is a top view illustrating a solid-state image sensor according to still another embodiment of the disclosure.

FIG. 15 is a top view illustrating a solid-state image sensor 30 according to one embodiment of the disclosure. FIG. 16 is a top view illustrating a solid-state image sensor 32 according to another embodiment of the disclosure. FIG. 17 is a top view illustrating a solid-state image sensor 34 according to still another embodiment of the disclosure.

As shown in FIG. 15, the first grid structure 121 of the solid-state image sensor 30 may defines a plurality of sensing areas S, and each of the sensing areas S may include nine ($3^2$) green color filter segments 115GS, nine ($3^2$) blue color filter segments 115BS, or nine ($3^2$) red color filter segments 115RS, but the present disclosure is not limited thereto.

As shown in FIG. 16, the first grid structure 121 of the solid-state image sensor 32 may defines a plurality of sensing areas S, and each of the sensing areas S may include sixteen ($4^2$) green color filter segments 115GS, sixteen ($4^2$) blue color filter segments 115BS, or sixteen ($4^2$) red color filter segments 115RS, but the present disclosure is not limited thereto.

As shown in FIG. 17, the first grid structure 121 of the solid-state image sensor 34 may defines a plurality of sensing areas S, and each of the sensing areas S may include twenty-five ($5^2$) green color filter segments 115GS, twenty-five ($5^2$) blue color filter segments 115BS, or twenty-five ($5^2$) red color filter segments 115RS, but the present disclosure is not limited thereto.

It should be noted that the number of first color filter segments or second color filter segments included in each of the sensing areas S is not limited to the foregoing embodiments, but it may be changed depending on actual demands.

In summary, compared with traditional grid structures with a constant grid height, the solid-state image sensor in the embodiments of the present disclosure includes the first grid structure and the second grid structure that have different grid heights, which may prevent the grid structures from generating diffraction, thereby improving the quality of the image signal from the photoelectric conversion elements (which may be arranged in, for example, normal pixels or of phase detection auto focus (PDAF) pixels) of the solid-state image sensors. Furthermore, crosstalk between different color filter layers may also be improved in the solid-state image sensor in the embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
    a plurality of photoelectric conversion elements;
    a first color filter layer disposed above the photoelectric conversion elements, and having a plurality of first color filter segments;
    a second color filter layer disposed above the photoelectric conversion elements and adjacent to the first color filter layer, and having a plurality of second color filter segments;
    a first grid structure disposed between the first color filter layer and the second color filter layer, and having a first grid height; and
    a second grid structure disposed between the first color filter segments and between the second color filter segments, and having a second grid height that is lower than or equal to the first grid height, wherein
    the first grid structure comprises a plurality of first grid segments; and
    in a cross-sectional view of the solid state image sensor, the second grid structure comprises a plurality of second grid segments, and a distance between two adjacent second grid segments placed in a central area of the solid-state image sensor is different from a distance between two adjacent second grid segments placed in an edge area of the solid-state image sensor by laterally extra-shifting the second grid segments placed in the edge area of the solid-state image sensor.

2. The solid-state image sensor as claimed in claim 1, wherein a height of the first color filter layer and a height of the second color filter layer are each lower than the first grid height.

3. The solid-state image sensor as claimed in claim 2, wherein the height of the first color filter layer and the height of the second color filter layer are higher than or equal to the second grid height.

4. The solid-state image sensor as claimed in claim 2, wherein the height of the first color filter layer is equal to or higher than the second grid height, and the height of the second color filter layer is lower than the second grid height.

5. The solid-state image sensor as claimed in claim 2, wherein the height of the first color filter layer and the height of the second color filter layer are each lower than the second grid height.

6. The solid-state image sensor as claimed in claim 1, wherein the second grid height is variable.

7. The solid-state image sensor as claimed in claim 1, wherein the first grid structure has a first grid width, and the second grid structure has a second grid width that is different from the first grid width.

8. The solid-state image sensor as claimed in claim 1, wherein the first grid structure includes a first base portion and a first additional portion disposed on the first base portion, and the second grid structure includes a second base portion and a second additional portion disposed on the second base portion.

9. The solid-state image sensor as claimed in claim 8, wherein a height of the first base portion is equal to a height of the second base portion, and a height of the first additional portion is higher than a height of the second additional portion.

10. The solid-state image sensor as claimed in claim 8, wherein a material of the first base portion is the same as a material of the second base portion, and a material of the first additional portion is the same as a material of the second additional portion.

11. The solid-state image sensor as claimed in claim 1, wherein the photoelectric conversion elements are arranged in a plurality of normal pixels and a plurality of phase detection auto focus pixels surrounded by the normal pixels.

12. The solid-state image sensor as claimed in claim 1, wherein in the cross-sectional view of the solid-state image sensor, the first grid structure is formed as a trapezoid, and the second grid structure is formed as a trapezoid.

13. The solid-state image sensor as claimed in claim 1, further comprising:
    a plurality of condensing structures disposed on the first color filter layer and the second color filter layer,
    wherein each of the condensing structures corresponds to at least two of the first color filter segments and the second color filter segments, the second grid height is equal to the first grid height, in the cross-sectional view of the solid-state image sensor.

14. The solid-state image sensor as claimed in claim 13, wherein each of the condensing structures corresponds to at least two of the first color filter segments and the second color filter segments.

15. The solid-state image sensor as claimed in claim 1, wherein in a top view of the solid-state image sensor, the first grid structure defines a plurality of sensing areas, each of the sensing areas includes x2 first color filter segments or x2 second color filter segments, and x is a positive integer that is greater than or equal to 2.

16. The solid-state image sensor as claimed in claim 1, wherein a refractive index of the first grid structure and a refractive index of the second grid structure are lower than a refractive index of the first color filter layer and a refractive index of the second color filter layer.

17. The solid-state image sensor as claimed in claim 16, wherein the refractive index of the first grid structure and the refractive index of the second grid structure are between 1.0 and 1.99.

\* \* \* \* \*